US005753928A

United States Patent [19]

Krause

[11] Patent Number: 5,753,928

[45] Date of Patent: May 19, 1998

[54] MONOLITHIC OPTICAL EMITTER-DETECTOR

[75] Inventor: Robert Krause, Menlo Park, Calif.

[73] Assignee: Siemens Components, Inc., Cupertino, Calif.

[21] Appl. No.: 607,052

[22] Filed: Feb. 26, 1996

Related U.S. Application Data

[63] Continuation-in-part of Ser. No. 129,814, Sep. 30, 1993, abandoned.

[51] Int. Cl.$^6$ ..................... G01B 27/00

[52] U.S. Cl. ..................... 250/551; 250/214.1; 257/84

[58] Field of Search ..................... 250/551, 214.1, 250/214 LS; 257/84, 85, 80–82

[56] References Cited

U.S. PATENT DOCUMENTS

| | | | |
|---|---|---|---|
| 3,582,661 | 6/1971 | Pijls | 250/205 |
| 3,699,407 | 10/1972 | Gurtler | 250/551 |
| 4,190,747 | 2/1980 | Feiner et al. | 250/205 |
| 4,221,485 | 9/1980 | Schulze | 250/574 |
| 4,275,404 | 6/1981 | Cassiday et al. | 257/85 |
| 4,588,896 | 5/1986 | Abbas | 250/214 LS |
| 4,667,212 | 5/1987 | Nakamura | 257/85 |
| 4,970,381 | 11/1990 | Huang et al. | 250/208.1 |
| 5,247,168 | 9/1993 | Pocholle et al. | 250/214 LS |
| 5,256,882 | 10/1993 | Miyasaka | 250/214 LS |

OTHER PUBLICATIONS

"A $Ga_{1-x}Al_xAs$ Monolithic Opto–Isolator" by R.J. Roedel et al., IEEE Electron Device Letters, vol. EDL–1, Nos. 2, Feb. 1980, pp. 15–17.

*Primary Examiner*—Que Le

*Attorney, Agent, or Firm*—Joseph S. Codispoti

[57] ABSTRACT

Optical feedback control in an optical emitter-detector combination can be improved by fabricating the two devices on a single substrate. The feedback radiation can then travel within a monolithic structure. This arrangement will yield greater uniformity in devices as well as provide for easier mechanical assembly.

44 Claims, 5 Drawing Sheets

150

EMITTER 156

DETECTOR 154

152

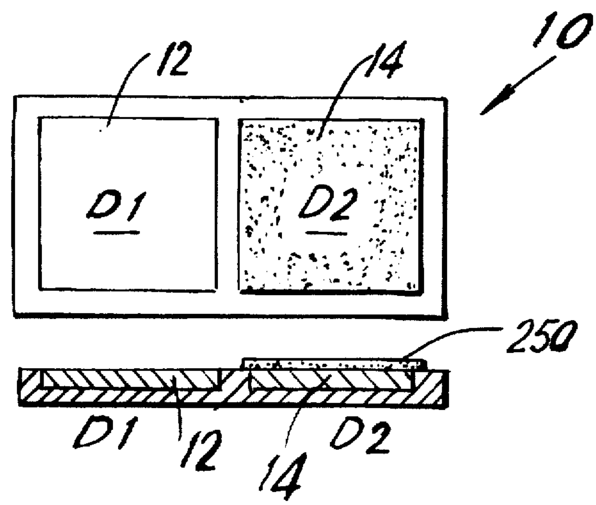
FIG.18
FIG.19
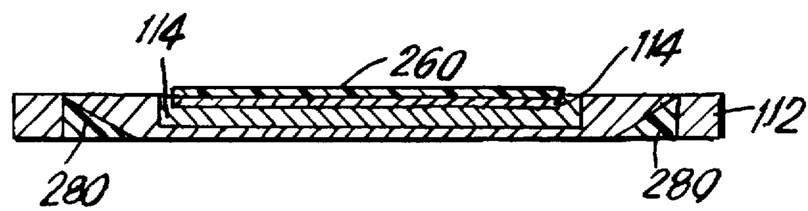
FIG.20
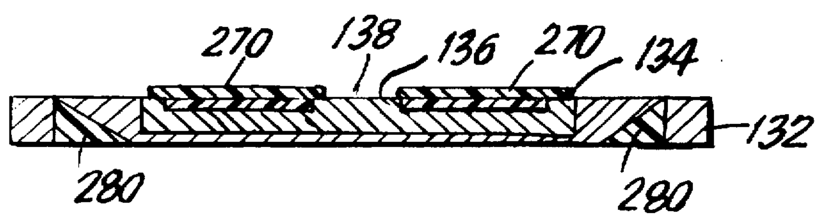
FIG.21
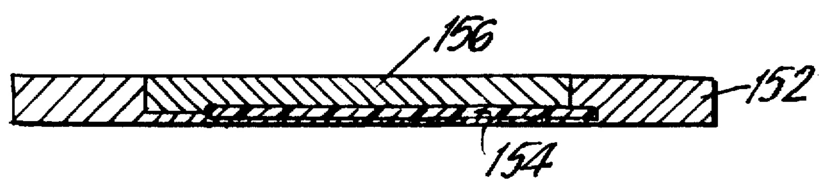
FIG.22

MONOLITHIC OPTICAL EMITTER-DETECTOR

This is a continuation-in-part, of application Ser. No. 08/129,814 filed Sep. 30, 1993, now abandoned.

FIELD OF THE INVENTION

This invention generally relates to optical electrical components. Specifically, the invention is directed to monolithic emitter-detector devices.

The invention is related to the bidirectional coupler of the type described in copending U.S. Patent Application entitled "Linear Bidirectional Optocoupler" by Robert Krause, the applicant herein, filed on Sep. 30, 1993 as U.S. patent application Ser. No. 08/129,640. The foregoing application is assigned to the same assignee as the present patent application and the details of it are incorporated herein by reference.

BACKGROUND OF THE INVENTION

Typically, optical emitters with a provision for optical output (power or flux) control using optical feedback are configured as a discrete emitter and a discrete optical detector. Such devices can be used as sources in linear optical couplers, as accurately controlled optical sources for meteorology applications, and in medical and industrial applications for absorption and reflection measurements.

In fabricating such devices, the emitter and detector are commonly placed on separate substrates because of the dissimilarity in materials and manufacturing processes—most detectors are fabricated from silicon while the emitters are gallium arsenide (GaAs) based. To obtain optical feedback, the radiation from the emitter is optically coupled back to the detector through an optical cavity.

By having the emitter and detector as discrete components, the cost of manufacturing the devices remains high. Two substrates are required in addition to the connections between the devices and outside circuitry. It is therefore desirable to provide an alternative device that offers lower fabrication costs.

SUMMARY OF THE INVENTION

The aforementioned problems are obviated by the present invention that provides a single monolithic emitter-detector. Although monolithic diode arrays are common, an example being a seven-segment configuration for digital readout applications, such arrays share a common substrate and are designed to have minimal crosstalk or optical coupling between diode elements. However, such coupling or crosstalk is desirable between the emitter and detector here, since it enhances the feedback from the emitter to the detector.

One embodiment of the invention is an emitter and a detector optically coupled within a monolithic substrate. The emitter could be fabricated from groups III–V or II–VI material and the detector from PN or PIN materials.

Possible configurations for the monolithic emitter-detector include a side-by-side layout where the emitter and detector are coupled at one edge, a peripherally-coupled device, and a vertically-configured arrangement with edge coupling. These are but three examples; other configurations are possible.

BRIEF DESCRIPTION OF THE DRAWINGS

A more complete understanding of the present invention, as well as other objects and advantages thereof not enumerated herein, will become apparent upon consideration of the following detailed description and the accompanying drawings, wherein:

FIG. 18 is a top view of the monolithic optical emitter-detector of FIG. 1 where the detector has a shield layer;

FIG. 19 is a cross-sectional elevation view of a monolithic optical emitter-detector of FIG. 1 where the detector has a shield layer;

FIG. 20 is a cross-sectional elevation view of the monolithic optical emitter-detector of FIG. 6 where the detector has a shield layer;

FIG. 21 is a cross-sectional elevation view of the monolithic optical emitter-detector of FIG. 7 where the detector has a shield layer; and FIG. 22 is another cross-sectional elevation view of the monolithic optical emitter-detector of FIG. 8.

DETAILED DESCRIPTION

The devices described here are based in part on the technology used in the Siemens® IL300 family of aluminum gallium arsenide (AlGaAs) linear optocouplers, discussed in the Siemens Optoelectronics Data Book 1993, pp. 5–115 through 5–122, and pp. 11–177 through 11–193. It should be understood that other devices can be used. Also, the couplers could be used with other types of electromagnetic radiation, such as infrared radiation or ultraviolet light.

Figure 1:
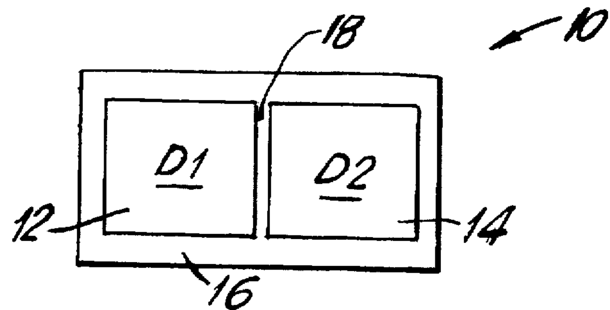
FIG. 1 is a top-view of a monolithic optical emitter-detector of the present invention where the emitter and detector are edge-coupled.

One configuration of a monolithic emitter-detector constructed in accordance with the present invention is shown in FIG. 1. The emitter-detector assembly 10 has a two diodes, an emitter D1 12 and a detector D2 14 on a single substrate 16. The emitter 12 and the detector 14 are adjacent or side-by-side, providing edge coupling through the substrate 16 in the region 18 shared by the two components 12 and 14.

In making the device 10, the LED wafer is sliced in such a fashion that two diodes remain attached to one another at one edge. Insulation between the adjacent diodes can be achieved by using either mechanical or chemical deposition methods. The device can be packaged as a three-lead LED or perform as a servo-controlled emitter in a linear coupler.

Figure 2:
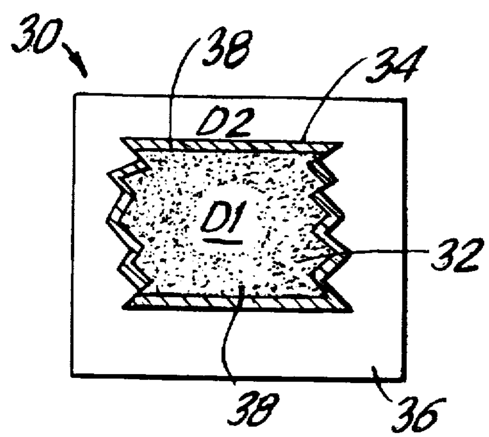
FIGS. 2–5 are cross-sectional views of monolithic optical emitter-detectors of the present invention where the emitter and detector are peripherally-coupled.

Monolithic emitter-detector devices can also be configured such that the emitter and detector are connected by a lateral, peripheral edge, as illustrated in FIGS. 2 through 5. In FIG. 2, the monolithic emitter-detector 30 shown has an emitter D1 32 that is physically surrounded by a detector D2 34. The emitter 32 and the detector 34 are positioned on a substrate 36. Coupling occurs at a peripheral edge 38. The emitter 32 can have any suitable shape such as round, oval, square, rectangular, curvilinear, or interdigitated.

Figure 3:
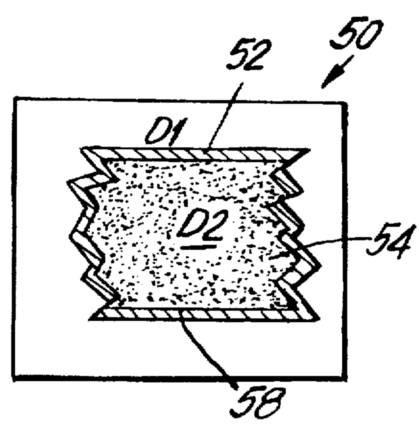

A similar monolithic emitter-detector 50 is shown in FIG. 3. Here, the emitter D1 52 surrounds the detector D2 54. Coupling occurs as in the device of FIG. 2 at a peripheral edge 58.

Figure 4:
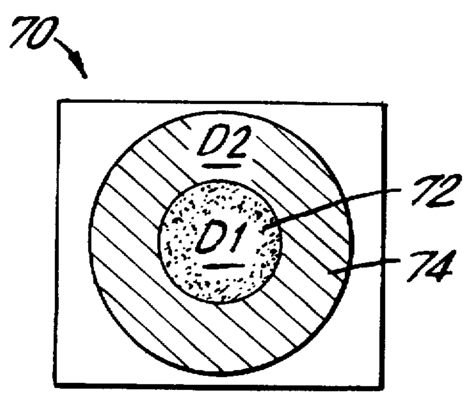
Figure 5:
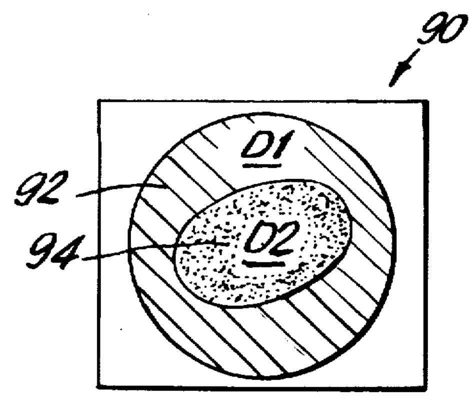

For illustration purposes, monolithic emitter-detectors 70 and 90 having round or oval emitters and detectors are shown in FIGS. 4 and 5, respectively. Each has its respective emitter D1 72 or 92 and detector D2 74 or 94.

The devices of FIGS. 2–5 can be packaged as a three-lead LED or perform as a servo-controlled emitter in a linear coupler.

Figure 6:
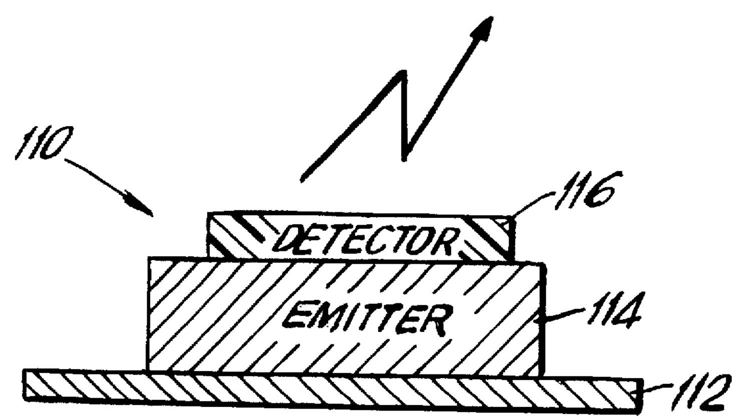
FIGS. 6–8 are cross-sectional elevation views of monolithic optical emitter-detectors of the present invention where the emitter and detector are vertically-coupled.
Figure 7:
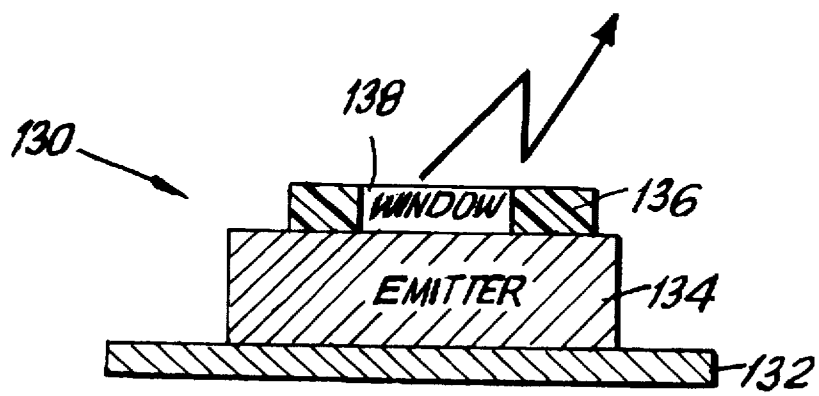
Figure 8:
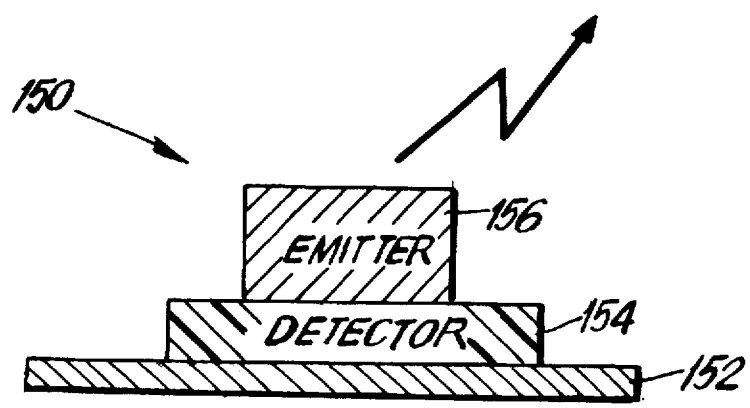
Figure 9:
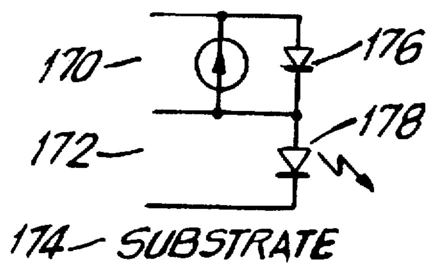
FIGS. 9–16 are schematic diagrams of monolithic optical emitter-detectors of the present invention where the emitter detector are vertically-coupled.
Figure 10:
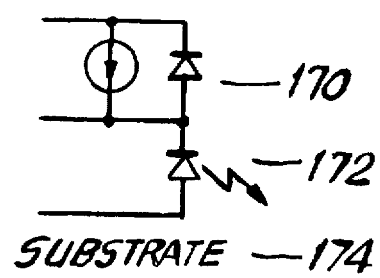
Figure 11:
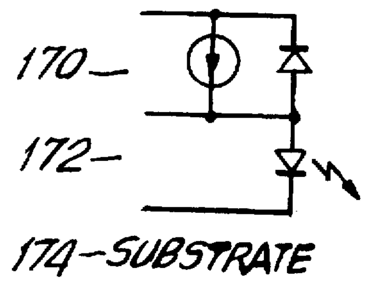
Figure 12:
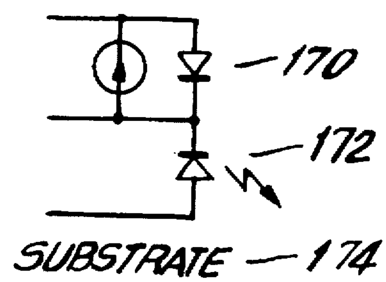
Figure 13:
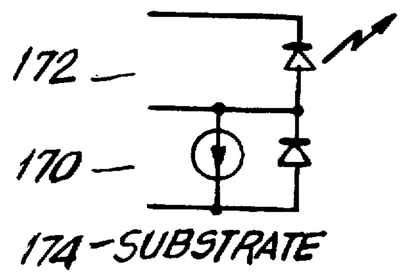
Figure 14:
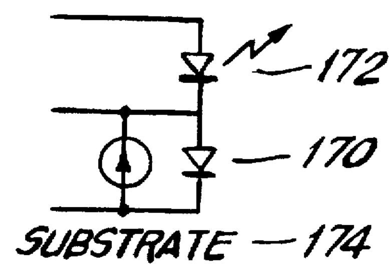
Figure 15:
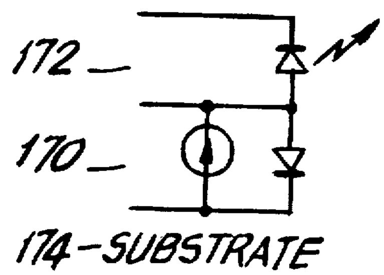
Figure 16:
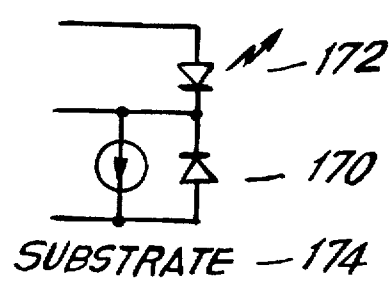

Monolithic emitter-detectors having vertically-coupled surfaces are shown in FIGS. 6–8. The first such device 110, in FIG. 6, has a substrate 112, an emitter 114, and a detector 116. The detector 116 can be physically or chemically grown on top of the emitter 114, the two being insulated from one another. The emitter 114 radiates through the detector 116 or through the substrate 112 if it is sufficiently transparent.

A second device 130 is shown in FIG. 7. Similar to the device in FIG. 6, this device 130 has a substrate 132, an emitter 134, and a detector 136. A window 138 in the detector 136 is provided by physical or chemical (etching) means and allows the optical radiation from the emitter 134 to pass through.

Finally, a third device 150 is depicted in FIG. 8. The device 150 has a substrate 152, a detector 154, and an emitter 156. The emitter 156 radiates upwardly, but some of its radiation also passes through the surface adjacent the detector 154, providing feedback to the detector 154 and permitting maximum coupling out of the emitter's 156 major radiating surface 158. Another rendering of the device 150 of FIG. 8 is shown in the cross-sectional elevation view of FIG. 22. This figure further illustrates that the detector 154 is shielded by the emitter 156.

In addition to positioning the detector over the emitter, or the reverse, the orientation of the anodes and cathodes of each diode must be considered. In FIGS. 9 through 16, eight variations are illustrated. In the devices shown in FIGS. 9 through 12, detectors 170 are positioned above emitters 172, which in turn sit on substrates 174. In the devices shown in FIGS. 13 through 16, the detectors 170 sit directly on the substrates 174, and the emitters 172 are positioned above the detectors 170.

Returning to FIGS. 9–12, the four circuits differ in how the diodes are interconnected. In the first (FIG. 9), the cathode 176 of the detector 170 is connected to the anode 178 of the emitter 172, while the anode of the detector 170 of the second device (FIG. 10) is connected to the cathode of the emitter 172. For the third and fourth devices, either the anodes (FIG. 11) or the cathodes (FIG. 12) are connected to each other. In the case of the emitter/detector/substrate arrangement of FIGS. 13–16, similar variations of diode interconnections are illustrated.

Figure 17:
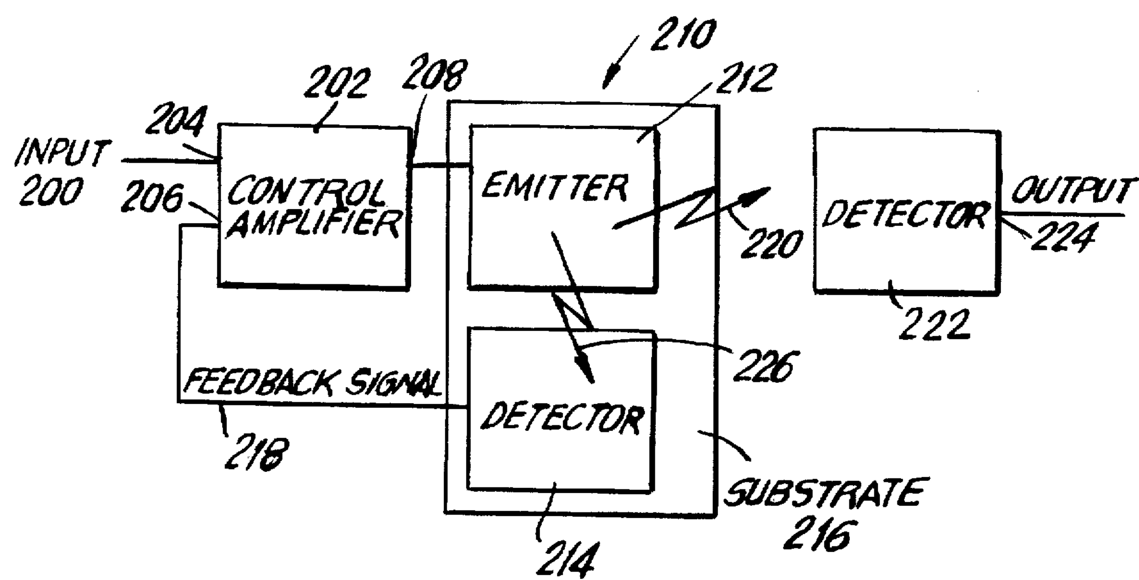
FIG. 17 is a block diagram of an application of the monolithic optical emitter-detector of the present invention.

An application of the monolithic optical emitter-detector of the present invention is shown in FIG. 17. The circuit shown is a linear coupler of the kind discussed in the copending application referenced above. The coupler has an input 200 that drives a control amplifier 202. The amplifier 202 has a signal input 204, a feedback input 206, and an output 208. The signal input 204 of the amplifier 202 is connected to the coupler input 200.

The next stage of the coupler is a monolithic emitter-detector 210, which has an emitter 212, a detector 214, and a substrate 216. The output 208 of the control amplifier 202 is provided to the emitter 212; the detector 214 provides a feedback signal 218 to the feedback input 206 of the amplifier 202. Optical radiation 222 generated by the emitter 212 illuminates an output detector 222 that generates an output 224, providing isolation between the input 200 and the output 224. At the same time, the detector 214 is receiving optical radiation 226 from the emitter 212 to develop the feedback signal 218.

Virtually the same circuitry can be used to construct a constant-controllable output flux LED lamp. Instead of an output detector 222, the optical radiation 220 of the emitter 212 is received by a human or electronic receiver 230 as appropriate to the application.

The detector in each of the configurations responds only to energy from the emitter received through the substrate or directly from an adjacent surface. The detector may be shielded from extraneous sources of energy by an opaque layer or by virtue of being packaged in an enclosure impervious to light. For example, as shown in FIGS. 18 and 19, detector D2 14 has a shield layer 250. The only energy reaching detector D2 14 originates at the emitter D1 12 and travels through the substrate 16. Similarly, in the configurations of FIGS. 6 and 7, shields 260 and 270 are provided as shown in FIGS. 20 and 21, respectively. Additionally, optional reflectors 280 are provided for the configurations of FIGS. 20 and 21 to provide an additional path for the optical energy generated by the emitter. The reflectors 280 could be situated outside of the substrate (112 or 132) if preferred.

While there has been described what is believed to be the preferred embodiment of the invention, those skilled in the art will recognize that other and further modifications may be made thereto without departing from the spirit of the invention, and it is intended to claim all such embodiments that fall within the true scope of the invention. For example, other configurations and geometries of the emitter and detector are contemplated.

What is claimed is:

1. A monolithic apparatus, comprising:

means for emitting radiation positioned on the means for supporting; and means for detecting radiation positioned on the means for supporting adjacent to the means for emitting, wherein the means for emitting is electrically coupled to the means for detecting and the means for detecting receives radiation only from the means for emitting.

2. The apparatus as set forth in claim 1, wherein the means for supporting is a non-insulating semiconductor substrate.

3. The apparatus as set forth in claim 1, wherein the means for emitting is electrically coupled to the means for detecting through the means for supporting.

4. The apparatus as set forth in claim 1, wherein the means for emitting and the means for detecting are coplanar.

5. The apparatus as set forth in claim 1, wherein the means for emitting and the means for detecting are physically joined at at least one point.

6. The apparatus as set forth in claim 1, wherein the means for detecting surrounds the periphery of the means for emitting.

7. The apparatus as set forth in claim 1, wherein the means for emitting surrounds the periphery of the means for detecting.

8. The apparatus as set forth in claim 1, wherein the means for emitting and the means for detecting have generally round geometries.

9. The apparatus as set forth in claim 1, wherein the means for emitting and the means for detecting have generally oval geometries.

10. The apparatus as set forth in claim 1, wherein the means for emitting and the means for detecting have generally curvilinear geometries.

11. The apparatus as set forth in claim 1, wherein the means for emitting and the means for detecting have generally rectangular geometries.

12. The apparatus as set forth in claim 1, wherein the means for emitting and the means for detecting have generally square geometries.

13. The apparatus as set forth in claim 1, wherein the means for emitting generates visible radiation.

14. The apparatus as set forth in claim 1, wherein the means for emitting generates infrared radiation.

15. The apparatus as set forth in claim 1, further including means for allowing radiation to pass out of the apparatus.

16. The apparatus as set forth in claim 1, further including means for shielding the means for detecting radiation.

17. A monolithic apparatus, comprising:

means for supporting;

means for emitting radiation positioned on the means for supporting; and means for detecting radiation positioned on the means for emitting, wherein the means for emitting is electrically coupled to the means for detecting and the means for detecting receives radiation only from the means for emitting.

18. The apparatus as set forth in claim 15, wherein the means for detecting comprises means for allowing radiation to pass out of the apparatus.

19. The apparatus as set forth in claim 18, wherein the means for allowing radiation to pass out of the apparatus is an etched window.

20. The apparatus as set forth in claim 17, wherein the means for supporting is a non-insulating semiconductor substrate.

21. The apparatus as set forth in claim 17, wherein the means for detecting is a diode having a cathode and the means for emitting is a diode having an anode, and the cathode is coupled to the anode.

22. The apparatus as set forth in claim 17, wherein the means for detecting is a diode having an anode and the means for emitting is a diode having a cathode, and the anode is coupled to the cathode.

23. The apparatus as set forth in claim 17, wherein the means for detecting and the means for emitting are diodes, each diode having an anode, and the anodes are coupled to one another.

24. The apparatus as set forth in claim 17, wherein the means for detecting and the means for emitting are diodes, each diode having a cathode, and the cathodes are coupled to one another.

25. The apparatus as set forth in claim 17, wherein the means for emitting generates visible radiation.

26. The apparatus as set forth in claim 17, wherein the means for emitting generates infrared radiation.

27. The apparatus as set forth in claim 17, wherein the means for emitting radiates through the means for detecting.

28. The apparatus as set forth in claim 17, further including means for shielding the means for detecting radiation.

29. A monolithic apparatus, comprising:

means for supporting;

means for detecting radiation positioned on the means for supporting; and means for emitting radiation positioned on the means for detecting, wherein the means for emitting is electrically coupled to the means for detecting and the means for detecting receives radiation only from the means for emitting.

30. The apparatus as set forth in claim 29, wherein the means for detecting is a diode having a cathode and the means for emitting is a diode having an anode, and the cathode is coupled to the anode.

31. The apparatus as set forth in claim 29, wherein the means for detecting is a diode having an anode and the means for emitting a diode having a cathode, and the anode is coupled to the cathode.

32. The apparatus as set forth in claim 29, wherein the means for detecting and the means for emitting are diodes, each diode having an anode, and the anodes are coupled to one another.

33. The apparatus as set forth in claim 29, wherein the means for detecting and the means for emitting are diodes, each diode having a cathode, and the cathodes are coupled to one another.

34. The apparatus as set forth in claim 29, wherein the means for emitting generates visible radiation.

35. The apparatus as set forth in claim 29, wherein the means for emitting generates infrared radiation.

36. The apparatus as set forth in claim 29, wherein the means for supporting is a non-insulating semiconductor substrate.

37. The apparatus as set forth in claim 29, further including means for allowing radiation to pass out of the apparatus.

38. The apparatus as set forth in claim 29, further including means for shielding the means for detecting radiation.

39. The monolithic optical emitter-detector as set forth in claim 38, further including an opaque shield layer or an enclosure impervious to light.

40. The monolithic optical emitter-detector as set forth in claim 38, further including an opaque shield layer or an enclosure impervious to light.

41. The monolithic optical emitter-detector as set forth in claim 38, further including an opaque shield layer or an enclosure impervious to light.

42. A monolithic optical emitter-detector, comprising:

a substrate;

an emitter positioned on the substrate; and a detector positioned on the substrate adjacent to the emitter, where the detector is electrically coupled to the emitter and receives radiation only from the emitter.

43. A monolithic optical emitter-detector, comprising:

a substrate;

an LED emitter positioned on the substrate; and a detector positioned on the emitter, where the detector is electrically coupled to the emitter and receives radiation only from the emitter.

44. A monolithic optical emitter-detector, comprising:

a substrate;

a detector positioned on the substrate; and an LED emitter positioned on the detector, where the detector is electrically coupled to the emitter and receives radiation only from the emitter.

* * * * *